United States Patent
Colgan et al.

(10) Patent No.: US 9,410,742 B2
(45) Date of Patent: Aug. 9, 2016

(54) HIGH CAPACITY MAGNETIC ANNEALING SYSTEM AND METHOD OF OPERATING

(71) Applicant: Tokyo Electron Limited, Minato-ku, Tokyo (JP)

(72) Inventors: Ian Colgan, Ballivor (IE); Ioan Domsa, Dublin (IE); George Eyres, Dublin (IE); Toru Ishii, Dublin (IE)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/752,235

(22) Filed: Jun. 26, 2015

(65) Prior Publication Data

US 2016/0069613 A1 Mar. 10, 2016

Related U.S. Application Data

(60) Provisional application No. 62/047,231, filed on Sep. 8, 2014.

(51) Int. Cl.

| H01L 21/67 | (2006.01) |
|---|---|
| H01L 27/22 | (2006.01) |
| F27B 1/10 | (2006.01) |
| H01L 21/673 | (2006.01) |
| H01L 21/677 | (2006.01) |
| H01L 21/687 | (2006.01) |

(52) U.S. Cl.
CPC ............ F27B 1/10 (2013.01); H01L 21/67103 (2013.01); H01L 21/67303 (2013.01); H01L 21/67751 (2013.01); H01L 21/68707 (2013.01); *H01L 2221/683* (2013.01)

(58) Field of Classification Search
CPC .................................................. H01L 21/67115
USPC .................................................. 438/795–799
See application file for complete search history.

(56) References Cited

U.S. PATENT DOCUMENTS

| 6,303,908 | B1 | 10/2001 | Yamaga et al. | |
|---|---|---|---|---|
| 6,833,107 | B2 * | 12/2004 | Kuriyama | C21D 1/04 219/411 |
| 2002/0048509 | A1 * | 4/2002 | Sakata | H01L 21/67017 414/800 |
| 2004/0018650 | A1 * | 1/2004 | Sasajima | C23C 16/52 438/14 |
| 2008/0210168 | A1 * | 9/2008 | Su | H01L 21/67109 118/729 |
| 2011/0200415 | A1 * | 8/2011 | Lenz | H01L 21/6719 414/226.05 |

FOREIGN PATENT DOCUMENTS

JP 58-92220 6/1983

\* cited by examiner

*Primary Examiner* — Karen Kusumakar
(74) *Attorney, Agent, or Firm* — Rothwell, Figg, Ernst & Manbeck, P.C.

(57) ABSTRACT

An annealing system and method of operating is described. The annealing system includes a vertical furnace having an inner cylindrical insulating tube and at least one heating element surrounding an outer surface thereof, wherein the inner cylindrical insulating tube defines a processing space into which a plurality of workpieces may be vertically translated and subjected to thermal and/or magnetic processing. The annealing system further includes a workpiece boat for carrying at least one hundred workpieces, a boat loader arranged beneath the vertical furnace, and configured to vertically translate the workpiece boat and position the workpieces within the processing space, and a magnet system arranged outside the vertical furnace and configured to generate a magnetic field within the processing space.

21 Claims, 7 Drawing Sheets

HIGH CAPACITY MAGNETIC ANNEALING SYSTEM AND METHOD OF OPERATING

CROSS-REFERENCE TO RELATED APPLICATIONS

Pursuant to 37 C.F.R. §1.78(a)(4), this application claims the benefit of and priority to U.S. Provisional Application No. 62/047,231 filed on Sep. 8, 2014, which is expressly incorporated by reference herein in its entirety.

BACKGROUND OF THE INVENTION

1. Field of Invention

The invention relates to an annealing system and method for processing a microelectronic workpiece, and in particular, a system and method for annealing one or more layers containing magnetic material on a microelectronic workpiece.

2. Description of Related Art

Magnetic annealing is one of three processes required to manufacture magnetoresistive random access memory (MRAM) devices compatible with conventional complementary metal oxide semiconductor (CMOS) logic based microelectronic workpieces. To successfully anneal a workpiece, the ferromagnetic layer must be held at a predetermined temperature in a magnetic field for a period of time long enough for the crystals to orient themselves in a common direction upon cooling. This process, which is also referred to as "soak" is carried out in an inert, reducing, or vacuum environment to prevent oxidation of the workpieces, while they are held at the predetermined temperature.

Magnetic annealing equipment generally operates in batch-mode, i.e., plural workpieces are annealed at the same time, and performs a sequence of steps. As an example, these steps include heating, soaking, and cooling the workpieces in the presence of a magnetic field, typically between 0.02 and 7.0 T (Tesla). The cost of MRAM device manufacturing is linked to the magnetic annealing tools, where the productivity (acceptable devices produced per hour) is the product of density (number of devices per workpiece), throughput (workpieces per hour), and yield (ratio of acceptable devices to total number of devices processed), as dictated by the overall thermal/anneal cycle.

Conventionally, magnetic annealing systems for in-plane and out-of-plane magnet orientation are of either a horizontal or vertical orientation. And, with manufacturing facility floor-space being a premium, tool footprint and workpiece throughput, as mentioned above, are critical for successful implementation.

SUMMARY OF THE INVENTION

Embodiments of the invention relate to an annealing system and method for processing a microelectronic workpiece, and in particular, a system and method for annealing one or more layers containing magnetic material on a microelectronic workpiece.

According to one embodiment, an annealing system is described. The annealing system includes a vertical furnace having an inner cylindrical insulating tube and at least one heating element surrounding an outer surface thereof, wherein the inner cylindrical insulating tube defines a processing space into which a plurality of workpieces may be vertically translated and subjected to thermal and/or magnetic processing. The annealing system further includes a workpiece boat for carrying at least one hundred workpieces, a boat loader arranged beneath the vertical furnace, and configured to vertically translate the workpiece boat and position the workpieces within the processing space, and a magnet system arranged outside the vertical furnace and configured to generate a magnetic field within the processing space.

According to another embodiment, a method for operating an annealing system is described. The method includes: loading at least one hundred workpieces into a first workpiece boat; vertically translating the first workpiece boat into a processing space of a vertical furnace using a boat loader, wherein the vertical furnace has an inner cylindrical insulating tube and at least one heating element surrounding an outer surface thereof, the inner cylindrical insulating tube defining the processing space; elevating a temperature of the at least one hundred workpieces by coupling power to the at least one heating element; generating a magnetic field within the processing space using a magnet system arranged outside the vertical furnace.

DETAILED DESCRIPTION OF SEVERAL EMBODIMENTS

Systems and methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As briefly described above, manufacturing facility floorspace is a premium, and thus, tool footprint and workpiece throughput are critical for successful implementation. The annealing system described below is the first of its kind in the magnetic annealing market that can be compatible with one hundred (100) workpiece capacity and SEMI S2 height requirements (3.5 m).

Figure 1:
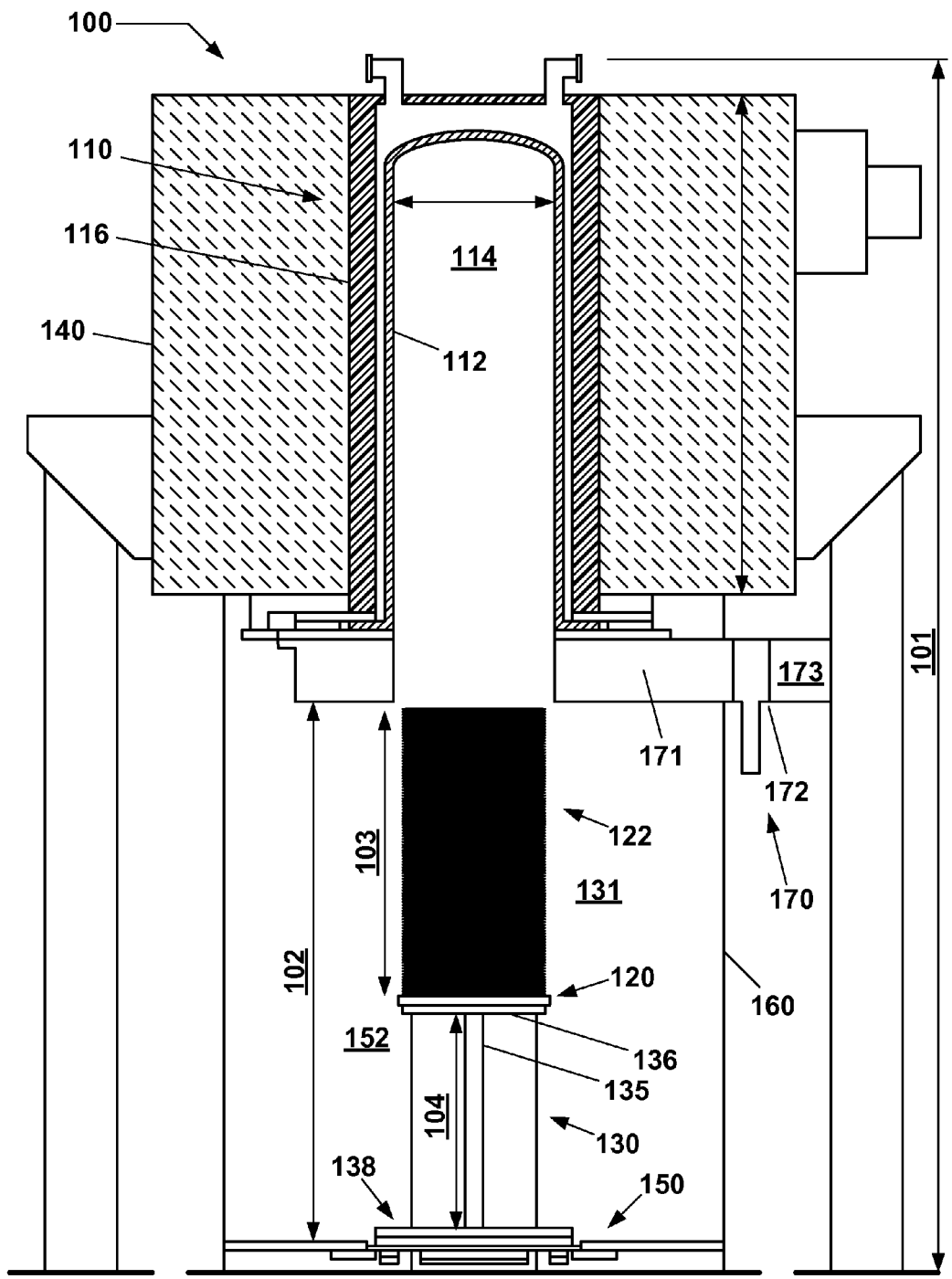
FIG. 1 is a schematic illustration of a side view of an annealing system according to an embodiment.
Figure 2:
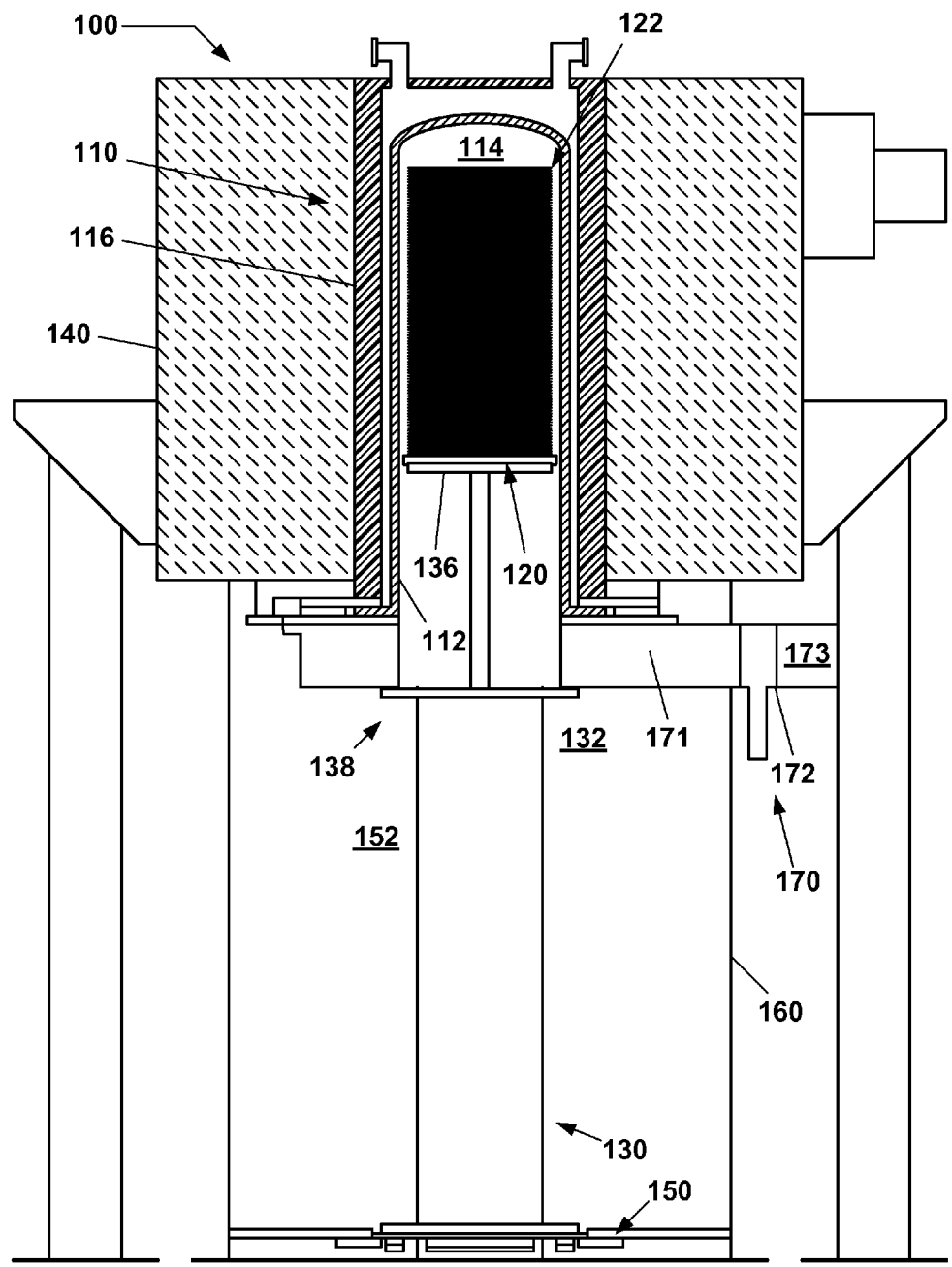
FIG. 2 is another schematic illustration of the annealing system depicted in FIG. 1.

Therefore, referring now to the drawings, wherein like reference numerals designate identical or corresponding parts throughout the several views, FIGS. 1 and 2 illustrate an annealing system for annealing a plurality of workpieces according to an embodiment. Annealing system 100 includes a vertical furnace 110 having an inner cylindrical insulating tube 112 and at least one heating element assembly 116 surrounding an outer surface thereof, wherein the inner cylindrical insulating tube 112 defines a processing space 114 into which a plurality of workpieces 122 may be vertically translated and subjected to thermal and/or magnetic processing.

It will be understood by those skilled in the art that the workpieces can be semiconductor substrates, wafers, MRAM devices/chips, giant magneto resistance (GMR) heads, hard disc drives, and any other device which may be annealed at an elevated temperature with or without a magnetic field present. Workpieces may include, for example, semiconductor wafers used in the manufacture of MRAM devices, wafers used in the manufacture of MTJ devices, GMR sensors, magnetization of metallic objects at elevated temperatures, degaussing of magnetic thin films, and other objects that require annealing under the influence of magnetic fields.

The annealing system 100 further includes a workpiece boat 120 for carrying at least one hundred workpieces 122, and a boat loader 130 arranged beneath the vertical furnace 110, and configured to vertically translate the workpiece boat 120 and position the workpieces 122 within the processing space 114. The workpieces 122 may be arranged in a horizontal orientation for closely spacing the workpieces 122 in processing space 114. In this orientation, for example, out-of-plane (e.g., perpendicular) magnetic annealing may be performed. The workpieces 122, which may include semiconductor workpieces, may be placed at a non-variable or variable pitch of about 2 mm to about 10 mm, when wafers are processed, in order to effectively perform the thermal cycle. For example, the plurality of workpieces may be arranged within the workpiece boat 120 at a pitch equal to or less than 6.5 mm. As yet another example, the pitch may range from 4 mm to 4.5 mm.

Figure 3:
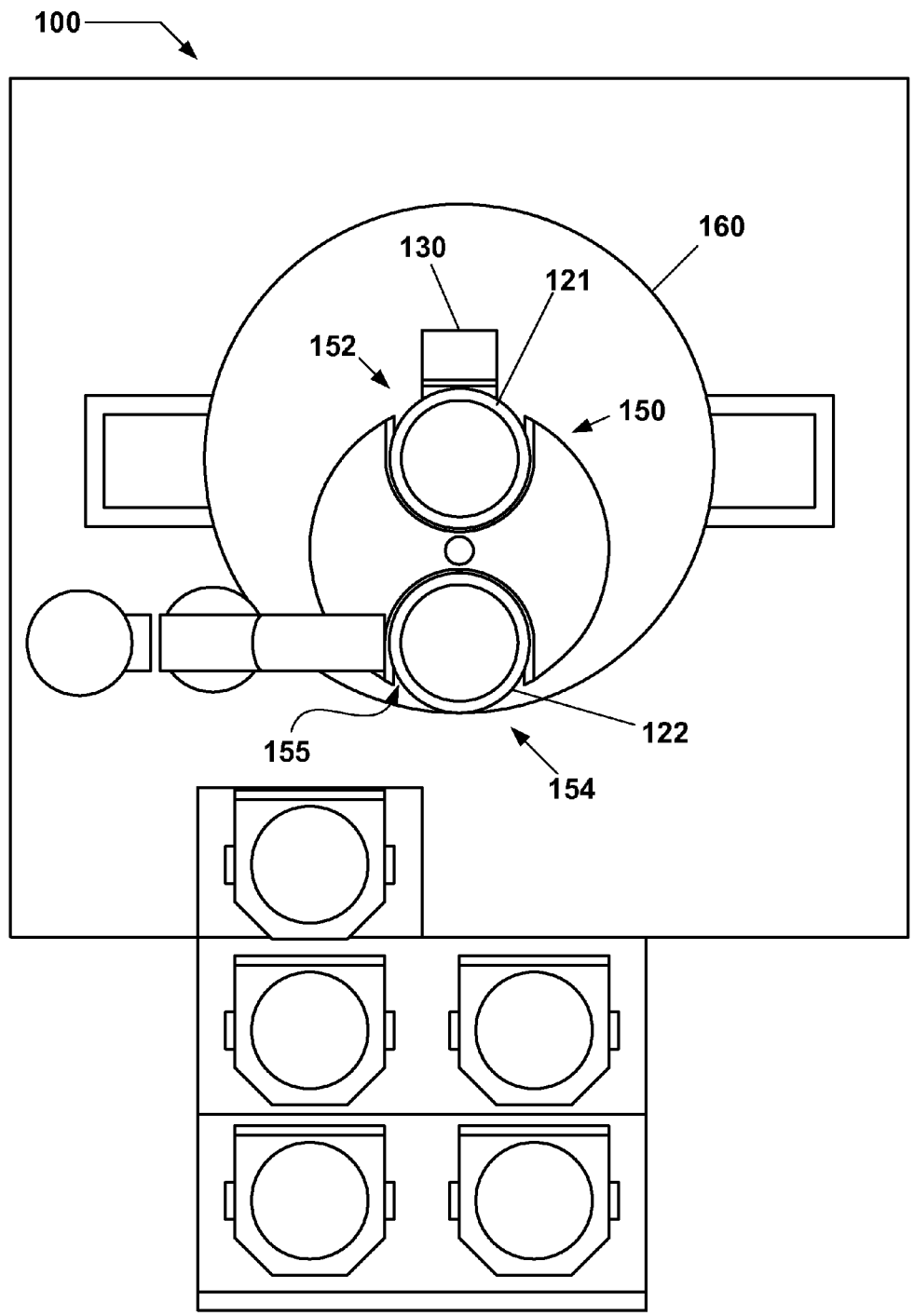
FIG. 3 is a schematic illustration of a top view of the annealing system depicted in FIG. 1.

Furthermore, as shown in FIGS. 1 and 3, the annealing system 100 includes a workpiece boat transport system 150 arranged beneath the vertical furnace 110, and configured to support at least two workpiece boats 121, 122 and index the at least two workpiece boats 121, 122 between a process position 152 and a load/unload position 154. The workpiece boat transport system 150 has an opening 155 to permit the boat loader 130 to engage and vertically translate the workpiece boat 120 into and out of the vertical furnace 110. The boat loader 130 and workpiece boat transport system 150 may be housed within an enclosure 160 to facilitate a reduced contamination environment.

The boat loader 130 is positioned in the process position 152, yet at a first elevation 131 beneath the vertical furnace 110. In FIG. 2, boat loader 130 is positioned in the process position 152, yet at a second elevation 132, wherein the boat 120 and workpieces 122 are placed within the vertical furnace 110. To achieve vertical elevation changes, the boat loader 130 includes a loading arm 135 oriented vertically and characterized by a length 104 ($L_a$) that is sufficiently long to locate the workpiece boat 120 within the bore of the magnet system 140 and the vertical furnace 110. The length $L_a$ of the loading arm 135 may range up to about 1 m. The boat loader 130 further includes a platform 136 located at a distal end of the loading arm 135, and configured to engage and support the workpiece boat 120 when loading and unloading the workpiece boat 120 to and from the vertical furnace 110, and a drive system 138 located at an opposing distal end of the loading arm 135, and configured to vertically translate the workpiece boat 120.

As shown in FIG. 1, the annealing system 100 has a total height 101 less than or equal to 3.500 m. To do so, for example, the height 102 of the enclosure 160 underneath the vertical furnace 110 (from the bottom of the vertical furnace 110 to the workpiece boat transport system 150) is less than or equal to 1.400 m, and the height 103 of the workpiece stack is less than or equal to 0.460 m.

Figure 5:
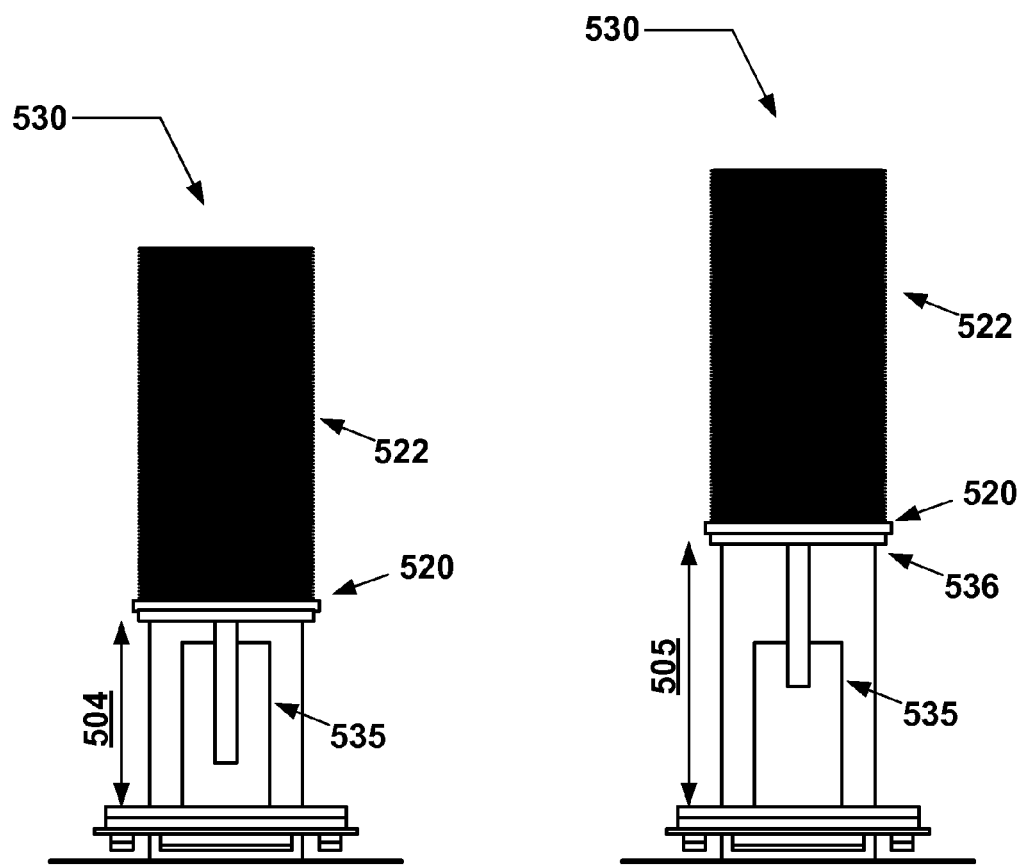
FIGS. 5A and 5B provide schematic illustrations of a boat loader according to another embodiment.

Referring now to FIGS. 5A and 5B, a boat loader 530 is shown according to an alternative embodiment. In order to further reduce the height 102 of the enclosure 160 underneath the vertical furnace 110 (from the bottom of the vertical furnace 110 to the workpiece boat transport system 150), the boat loader 530 includes a retractable loading arm 535 that may be characterized by a retracted length 504 ($L_{a,r}$) and an extended length 505 ($L_{a,e}$), the latter being sufficiently long to locate a workpiece boat 520 with workpieces 522 within the bore of the magnet system 140 and the vertical furnace 110. The extended length $L_{a,e}$ of the retractable loading arm 535 may range up to about 1 m (i.e., approximately the same as the non-retractable loading arm), and the retracted length $L_{a,r}$ of the retractable loading arm 535 may range up to about 0.6 m. FIG. 5A depicts the retractable loading arm 535 in a retracted state, and FIG. 5B depicts the retractable loading arm 535 in an extended state. In designing the loading arm to be retractable and extendable, the space required underneath the vertical furnace is reduced, and the vertical distance to be translated by the boat loader is also reduced. To impart the retraction and extension movement of the retractable loading arm 535, an actuating mechanism is used, wherein the actuating mechanism may include any electrical, mechanical, electromechanical, hydraulic, or pneumatic device.

In the second elevation 132, the vertical furnace 110 may be sealed and evacuated to a reduced pressure relative to ambient pressure using pumping system 170. A process gas may or may not be introduced to the vertical furnace 110 at a predetermined flow rate from a gas source (not shown). As shown in FIGS. 1 and 2, vertical furnace 110 is connected via evacuation line 171 to pumping system 170 for evacuating the process chamber and creating vacuum therein. The pumping system may include a vacuum pump 173 and valve 172, which in tandem permits controllably drawing a vacuum in the range of $10^{-8}$ to 100 Torr. In an exemplary embodiment, the vacuum pump 173 may include a roughing pump and/or a high vacuum pump. The roughing pump is employed to draw a vacuum to about $10^{-3}$ Torr, while the high vacuum pump is subsequently employed to further reduce the vacuum pressure to $10^{-7}$ Torr or lower. The roughing pump can be selected from among an oil sealed pump or dry pump, while the high or hard vacuum pump can be selected from among, turbomolecular pumps, diffusion pumps, cryo-pumps, or any other device capable of drawing the requisite vacuum.

Furthermore, the annealing system 100 includes a temperature control system (not shown) coupled to the heating element assembly 116 and configured to controllably adjust the temperature of the workpieces 122 to a predetermined value or sequence of values of temperature. The temperature control system may include one or more arrays of heating elements arranged around or adjacent to the vertical furnace 110 (e.g., arranged to surround the vertical furnace 110), and configured to heat and cool the workpieces 122 according to an anneal temperature recipe. For example, the one or more arrays of heating elements may include one or more resistive heating elements, one or more heated or cooled fluid conduits or jackets, one or more radiation sources (e.g., infrared (IR) source/lamp, ultraviolet (UV) source/lamp, etc.), etc.

Further yet, the annealing system 100 includes a magnet system 140 arranged outside the vertical furnace 110, and configured to generate a magnetic field within the processing space 114. The magnetic field may be designed to possess a predetermined magnetic field strength and orientation within the interior of the vertical furnace 110. The magnet system 140 may include one or more magnets arranged in a solenoidal or Helmholtz configuration around or adjacent the vertical furnace 110. For example, the magnet system 140 may include a superconducting magnet, an electromagnet, or a permanent magnet, or a combination of two or more thereof. The magnet system 140 can be configured to generate a magnetic field ranging from about 0.02 to 10 T (Tesla) within the vertical furnace 110.

While not shown, the annealing system 100 may also include a controller coupled to the temperature control system, the magnet system 140, and the pumping system 170, and configured to send and receive programmable instructions and data to and from the components of the annealing system 100. For example, the controller may be programmed to control the anneal temperature of the workpieces, the anneal time period, the magnetic field strength, the pressure in the vertical furnace 110, the process gas flow rate (if any) delivered to the vertical furnace 110, and the temporal and/or spatial variation of any of these process parameters.

Figure 4:
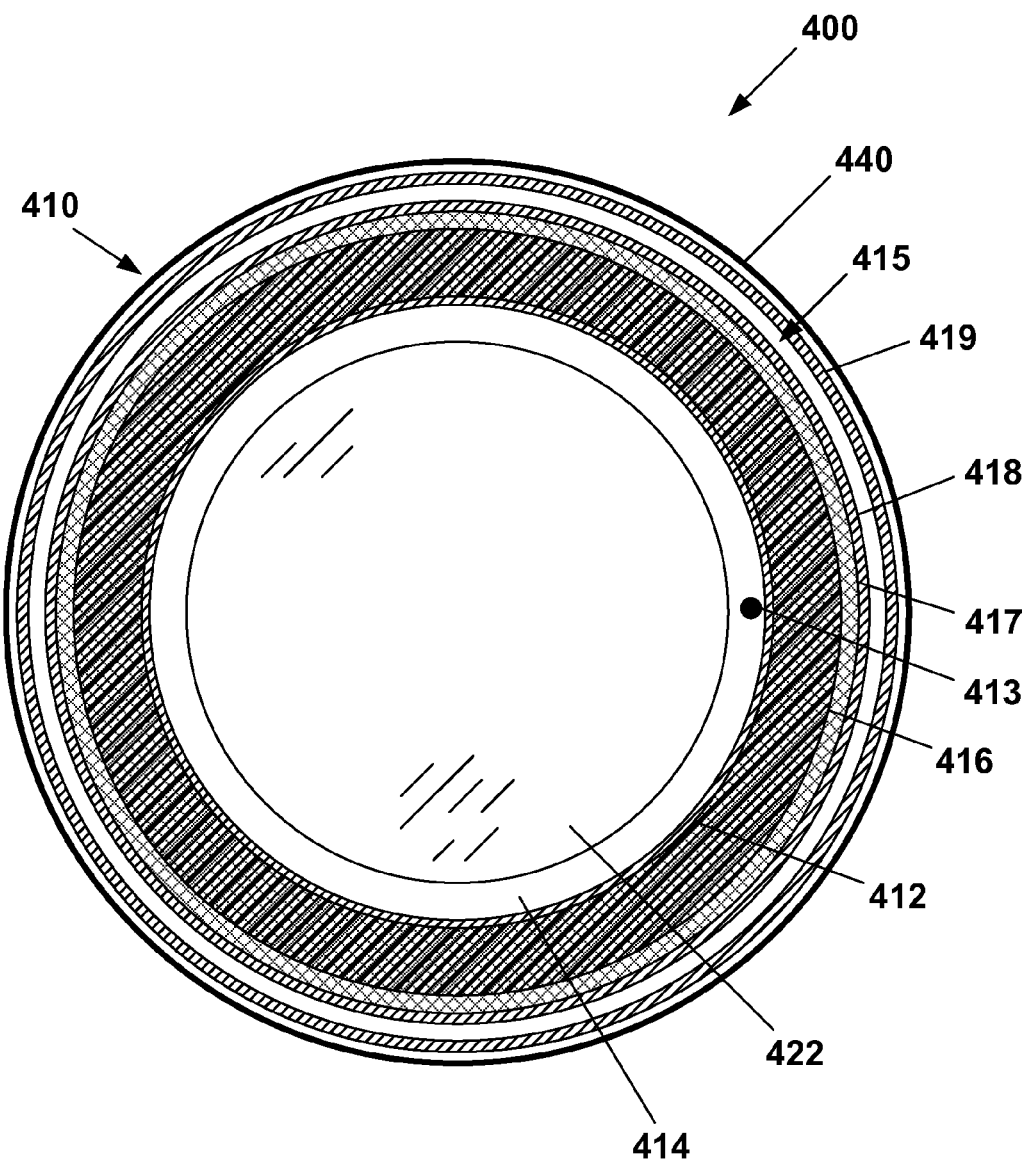
FIG. 4 provides a cross-sectional view of at least part of an annealing system according to an embodiment.

Referring now to FIG. 4, a cross-sectional view of at least part of an annealing system 400 is provided according to an embodiment. More specifically, this partial cross-section details the structure of vertical furnace 110 beginning with the inner wall 440 of the magnet bore outside vertical furnace 410 and proceeding radially inward to the processing space 414 within which workpieces 422 are treated.

Surrounding processing space 414 is inner cylindrical insulating tube 412. Inner cylindrical insulating tube 412 surrounds the workpieces 422, and forms a barrier between processing space 414 and heating element assembly 416. The inner cylindrical insulating tube 412 may be sealed at either distal end by means of demountable gasket seals (e.g., O-rings). Furthermore, the inner cylindrical insulating tube 412 may be composed of any type of material suitable for use in a semiconductor fab. Preferred materials are those with high emissivity, high thermal conductivity, or low heat capacity, or a combination thereof. Typically, the inner cylindrical insulating tube 412 is manufactured from transparent, fused silica glass (i.e., quartz), which is partially transparent to wavelengths in the electromagnetic spectrum ranging from of 0.78 to 1000 microns (e.g., infrared spectrum), or silicon carbide which has high emissivity and thermal conductivity.

When manufacturing silicon workpieces in a temperature range of 100 to 400 degrees C., for example, the transmissivity of the quartz wall or tube ranges from 5 to 12 percent, which in accordance with Kirchoff's law, the emissivity of the quartz is in the range of 88 to 95 percent. Alternatively, the inner cylindrical insulating tube 412 can include stainless steel. Although stainless steel has a lower emissivity than quartz or silicon carbide, the tube may be fabricated thinner, thereby reducing total heat capacity, as well as reducing the bore dimension of the magnet. Furthermore, stainless steel can be welded or sealed in other ways that are not possible with quartz or silicon carbide.

Surrounding the inner cylindrical insulating tube 412 is the heating element assembly 416. The heating element assembly 416 includes one or more heating elements, such as resistive heating elements. Preferably, the heater elements are selected from an array of electrical resistance heaters sufficient to provide and maintain an anneal temperature. As utilized herein, annealing temperatures range from about 200-1000 degrees C., depending on the device being manufactured. Furthermore, the heater elements may be wound so as to cancel out forces generated by the strong magnetic field in which they are disposed.

As an example, the one or more heating elements may include metal heating elements composed of nickel-chrome alloys or iron-chrome alloys, ceramic heating elements, or composite heating elements. Furthermore, the heating element assembly 416 may include one or more heating assembly zones that can be independently monitored and controlled using, for example, one or more sensors 413. For example, spatially controlled, or uniform, heating of the workpieces 422 can be accomplished by independently providing energy and control of the various heater elements in the heating element assembly 416. In one embodiment, the heater elements are divided axially into three different zones, wherein the center zone heater is aligned with the workpiece stack. And, two end zone heaters are provided above and below the center heater, respectively, and are independently controlled. Alternatively, the center zone heater may be divided into two independently controlled central heating zones.

In another embodiment, the heaters can be divided azimuthally into separate zones, for instance, three heaters each covering 120 degrees. The power input to each heated zone can be varied separately to achieve uniform heating. Generally, the thermal mass of the heater elements and inner cylindrical insulating tube 412 should be minimized to reduce the power input for a given temperature rise, and heat removal for a given temperature drop. In other words, it is desirable for the workpieces 422 to be the largest thermal mass in the system. In this manner, the possibility of temperature non-uniformity is greatly reduced.

In a particular embodiment, the heating element assembly 416 may include an element chamber that can be sealed and fluidly connected to a means for drawing a vacuum within the element chamber. The means for drawing vacuum can include any one or more of the pumps described above with respect to vertical furnace 110. Separately, a heat transfer gas can be introduced into the element chamber, and the environment surrounding the heating elements may be controlled.

Surrounding the heating element assembly 416 is an insulation layer 417 to thermally shield the magnet system from the heating element assembly 416. The insulation layer 416 may include MICROTHERM® panels commercially available from Microtherm nv, BE.

Surrounding the insulated, heating element assembly 416 is a cooling jacket that includes a pair of outer cylindrical tubes 418, 419 between which is an annular channel 415 for flowing a heat transfer fluid. Heat transfer fluid can be circulated through the annular channel 415 at a flow rate of about 1 to 20 liters per minute (e.g., 5-10 liters per minute), and at a temperature of about 20 degrees C. (other temperatures are acceptable). The annular channel 415 is configured for maximum heat transfer efficiency when the heating element assembly 416, or both the heating element assembly 416 and the vertical furnace 410 are running in conduction mode (i.e., during the cooling phase of the thermal/anneal cycle), and prevents the overheating of the magnet system by maintaining the exterior temperature below about 35 degrees C. The heat transfer fluid employed in the annular channel 415 may include, but is not limited to, water, a 50/50 solution of water and ethylene glycol, or any fluid that provides the requisite cooling temperature. In the event ethylene glycol is used, a cooling temperature lower than 20 degrees C. can be obtained. Forced air cooling could also be used.

Figure 6:
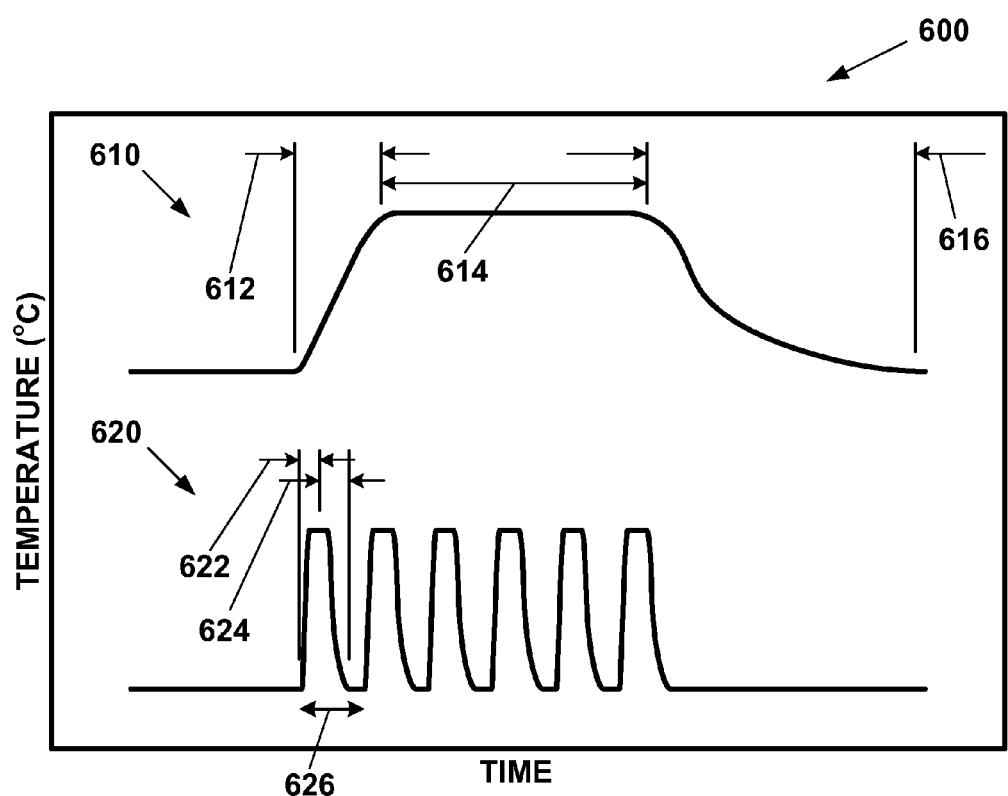
FIG. 6 provides a schematic illustration of an anneal temperature recipe according to various embodiments.

Annealing systems 100, 400 may be operable for magnetic and non-magnetic annealing of workpieces. The anneal process condition, including the anneal temperature recipe, is selected depending on the desired film properties of layers to be annealed on the workpiece. Referring now to FIG. 6, several anneal temperature recipes 600 are illustrated for achieving the desired result. For example, the anneal temperature recipe may include a continuous anneal sequence 610 or a pulsed anneal sequence 620.

In the continuous anneal sequence 610, the anneal temperature recipe includes ramping the temperature from ambient temperature (or a system idle or another elevated temperature) to a first anneal temperature during a first time duration 612, maintaining the first anneal temperature for a second time duration 614, and ramping down the temperature from the first anneal temperature to a reduced temperature at or above the ambient temperature during a third time duration 616. The continuous anneal sequence 610 may further include an anneal temperature recipe that additionally ramps the temperature from the first anneal temperature to a second anneal temperature during a fourth time duration, and maintains the second anneal temperature for a fifth time duration.

In the pulsed anneal sequence 620, the anneal temperature recipe includes rapidly ramping up the temperature from ambient temperature (or a system idle or another elevated temperature) to a first anneal temperature during a first time duration 622, rapidly ramping down the temperature from the first anneal temperature to a reduced temperature at or above the ambient temperature during a second time duration 624, and optionally repeating the rapidly ramping up the temperature and rapidly ramping down the temperature for one or more anneal temperature cycles 626.

In an exemplary embodiment, a method for annealing workpieces at a certain temperature so as to orient the crystals in a specific direction is contemplated. Workpieces 120, 420 are placed onto a boat for treatment within a vertical furnace in a predetermined environment. The workpieces 120, 420 are held at a predetermined temperature, while a magnetic field is optionally applied via magnet system 140. For example, the optionally imposed magnetic field may have a field strength of approximately 0.05 T to approximately 10 T, e.g., 1 T, 2 T, or 5 T. This latter step is commonly referred to as a "soaking" step.

Thereafter, steps are taken to achieve the desired cooling effect (i.e., heat transfer from the workpieces 120, 420, to the heat transfer fluid in the annular chamber 415). Cooling of workpieces 120, 420 proceeds to attain a temperature sufficiently low to allow their removal from the annealing system 100, 400. An exemplary anneal process condition associated with magnetic annealing may include a continuous anneal sequence as follows: (i) heating the workpieces 120, 420 to 300 degrees C. for about forty five minutes; (ii) soaking the workpieces 120, 420 for two hours at 300 degrees C.; and (iii) cooling the workpieces 120, 420 to about 100 degrees C. over about seventy minutes.

Figure 7:
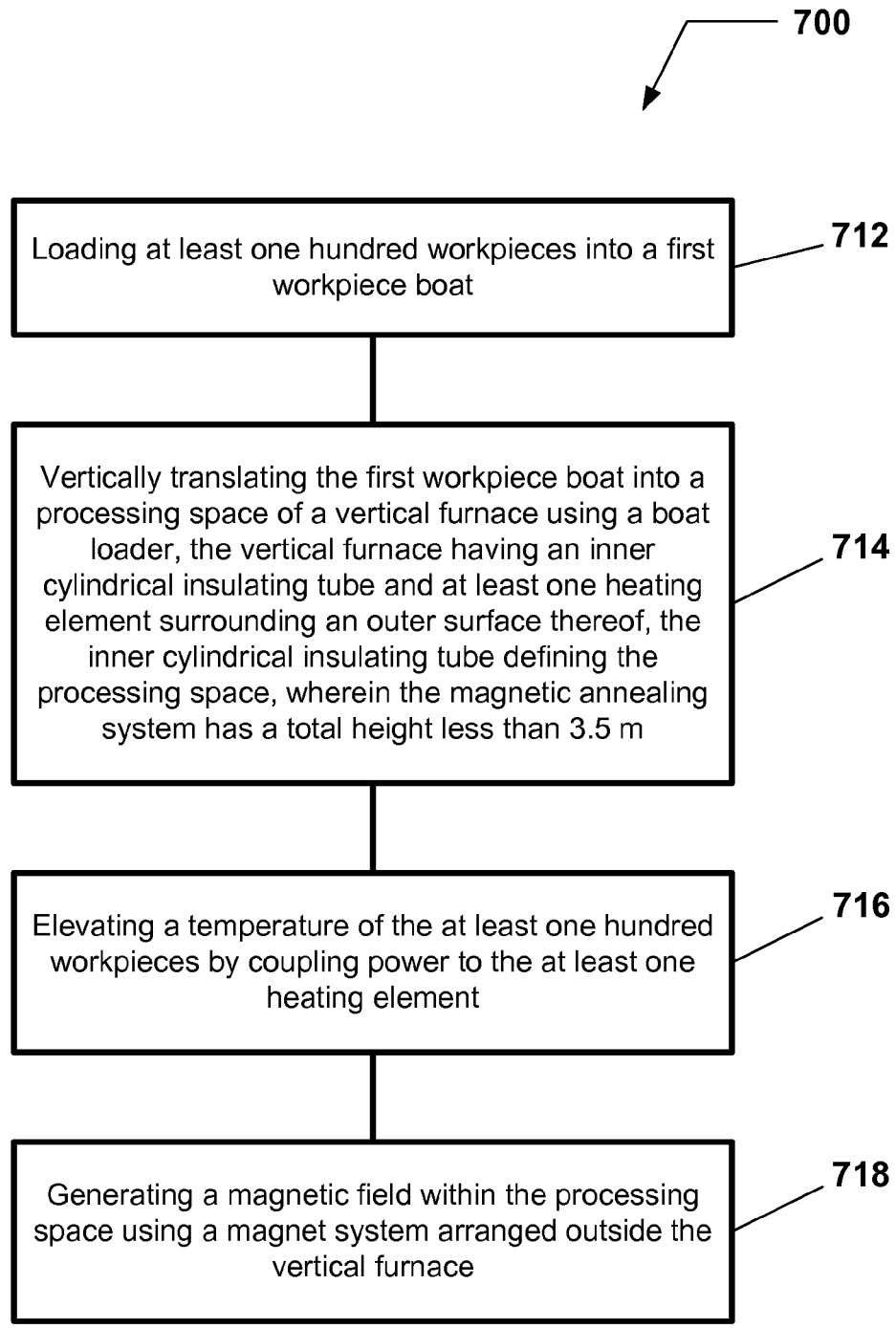
FIG. 7 provides a flow chart presenting a method of annealing a microelectronic workpiece in an annealing system according to an embodiment.

FIG. 7 illustrates a method for annealing a plurality of workpieces in an annealing system according to an embodiment. The method is illustrated in a flow chart 700, and begins in 712 with loading at least one hundred workpieces into a first workpiece boat. At least one workpiece may include a multilayer stack of thin films, wherein the multilayer stack of thin films includes at least one layer containing magnetic material.

The multilayer stack may include any material suitable for fabricating a microelectronic device, such as a memory cell depending on layers containing magnetic material for either the basis of its information storage or switching of its memory state(s). These devices may include, but not be limited to, magnetoresistive random access memory (MRAM), current switching toggle magnetic structures, magnetic tunnel junction (MTJ) devices, spin torque transfer (STT) devices, spin valves, and pseudo-spin valves. Exemplary materials may include metals, such as Ru, Co, Fe, Pt, Ta, Ir, Mn, etc., and metal alloys, such as NiFe, CoFe, etc. And, these materials may be deposited using any suitable method, such as sputtering, physical vapor deposition (PVD), chemical vapor deposition (CVD), atomic layer deposition (ALD), and plasma-assisted variations thereof, for example.

In one embodiment, the multilayer stack includes one or more layers containing magnetic material. The layer containing magnetic material may include ferromagnetic and/or antiferromagnetic materials. As an example, a microelectronic device having a magnetic tunnel junction (MTJ) can include two electrode layers composed of a ferromagnetic material and separated by a thin tunneling barrier, such as magnesium oxide or aluminum oxide. When the magnetic moments of the two electrode layers are oriented parallel to one another, the resistance to current flow across the magnetic tunnel junction is relatively low. And conversely, when the magnetic moments of the two electrode layers are oriented antiparallel to one another, the resistance to current flow across the magnetic tunnel junction is relatively high. The resultant microelectronic device may be based on the switching of these two resistive states, the performance of which may be characterized by the MR, as described above.

In 714, the first workpiece boat is vertically translated into a processing space of a vertical furnace using a boat loader, wherein the vertical furnace has an inner cylindrical insulating tube and at least one heating element surrounding an outer surface thereof. Additionally, the inner cylindrical insulating tube defines the processing space, wherein the annealing system has a total height less than 3.5 m. The annealing system may include any one of the embodiments presented in FIGS. 1 through 5.

Thereafter, in 716, a temperature of the at least one hundred workpieces is elevated by coupling power to the at least one heating element.

And, in 718, a magnetic field is generated within the processing space using a magnet system arranged outside the vertical furnace.

The method of annealing may performed according to an anneal process condition that includes: (1) elevating a temperature of the at least one hundred workpieces relative to ambient temperature for an anneal time period according to an anneal temperature recipe, or (2) exposing the at least one hundred workpieces to a magnetic field for an anneal time period according to an anneal magnetic field recipe, or (3) performing both the elevating the temperature of the at least one hundred workpieces and the exposing the at least one hundred workpieces to a magnetic field, wherein the anneal process condition is selected to adjust a property of the layer containing magnetic material.

The anneal process condition may be selected to adjust a property of the layer containing magnetic material. The property of the layer containing magnetic material may include crystallization, uniaxial anisotropy, magnetoresistance ratio (MR), or resistance area product, or a combination of two or more thereof. As an example, the annealing may be performed to transition a composition of the layer containing magnetic material from a substantially amorphous phase to a substantially crystalline phase, and produce a desired anisotropy direction in or at the surface of the layer containing magnetic material.

According to embodiments described herein, the annealing of the layer containing magnetic material may include elevating a temperature of the layer containing magnetic material, or imposing a magnetic field on the layer containing magnetic material, or both elevating a temperature of the layer containing magnetic material and imposing a magnetic field on the layer containing magnetic material.

The anneal process condition may include setting and adjusting one or more process parameters for controlling the annealing process. The one or more process parameters may include an anneal temperature for thermally treating the at least one hundred workpieces when the at least one hundred workpieces require annealing at an elevated temperature, the anneal time period for performing the annealing process, the gaseous composition of the process environment within which the one or more workpieces are annealed, the pressure within the annealing system, the field strength of an imposed magnetic field when the one or more workpieces require annealing in a magnetic field, etc.

During annealing, the anneal temperature of the at least one hundred workpieces may be elevated according to an anneal temperature recipe that includes a peak temperature ranging from about 200 degrees C. to about 600 degrees C. For example, the peak temperature may range from about 250 degrees C. to about 350 degrees C. The anneal time period may range up to about 100 hours. For example, the anneal time period may range from about 1 second to about 10 hours.

Furthermore, during annealing, the at least one hundred workpieces may be exposed to a magnetic field according to an anneal magnetic field recipe that includes a field strength ranging up to 10 T. For example, the magnetic field may have a field strength ranging up to 2 T. The anneal time period may range up to about 100 hours. For example, the anneal time period may range from about 1 second to about 10 hours.

The method of annealing may further include the following: prior to vertically translating the first workpiece boat, indexing the first workpiece boat from a load/unload position to a process position using a workpiece boat transport system arranged beneath the vertical furnace; and loading at least one hundred workpieces into a second workpiece boat, as shown in FIGS. 1-3. Further yet, the method of annealing may include vertically extending a loading arm of the boat loader when vertically translating the first workpiece boat into said vertical furnace; and vertically retracting the loading arm of the boat loader when vertically translating the first workpiece boat out of the vertical furnace, as shown in FIGS. 1, 2, 5A, and 5B.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. An annealing system, comprising:
   a vertical furnace having an inner cylindrical insulating tube and at least one heating element surrounding an outer surface thereof, said inner cylindrical insulating tube defining a processing space into which a plurality of workpieces are configured to be vertically translated and subjected to thermal and/or magnetic processing;
   a workpiece boat configured to carry at least one hundred workpieces;
   a boat loader arranged beneath said vertical furnace, and configured to vertically translate said workpiece boat and position said workpieces within said processing space; and
   a magnet system arranged outside said vertical furnace, and configured to generate a magnetic field within said processing space,
   wherein said annealing system has a total height less than 3.5 m.

2. The system of claim 1, further comprising:
   a workpiece boat turntable arranged beneath said vertical furnace, and configured to support at least two workpiece boats and index said at least two workpiece boats between a process position and a load/unload position, said workpiece boat turntable having an opening to permit said boat loader to engage and vertically translate said workpiece boat into and out of said vertical furnace.

3. The system of claim 1, wherein said plurality of workpieces are arranged within said workpiece boat at a pitch equal to or less than 4.6 mm.

4. The system of claim 1, wherein said plurality of workpieces are arranged within said workpiece boat at a pitch equal to or less than 4 mm.

5. The system of claim 1, wherein said boat loader comprises:
   a loading arm oriented vertically and characterized by a length $L_a$ that is sufficiently long to locate said workpiece boat within said bore of said magnet system and said vertical furnace;
   a platform located at a distal end of said loading arm, and configured to engage and support said workpiece boat when loading and unloading said workpiece boat to and from said vertical furnace; and
   a drive system located at an opposing distal end of said loading arm, and configured to vertically translate said workpiece boat.

6. The system of claim 5, wherein said length $L_a$ ranges up to about 1 m.

7. The system of claim 5, wherein said length $L_a$ ranges up to about 0.9 m.

8. The system of claim 5, wherein said loading arm is a retractable loading arm that extends to length $L_a$ when positioning said workpiece boat at an extended height for workpiece processing within said vertical furnace, and retracts to length $L_{a,r}$ less than $L_a$, when positioning said workpiece boat at a retracted height for workpiece loading and unloading.

9. The system of claim 5, wherein said length $L_{a,r}$ ranges up to about 0.6 m.

10. The system of claim 1, further comprising:
a workpiece handling robot configured to load and unload two workpieces at a time into and out of said workpiece boat.

11. The system of claim 10, wherein said workpiece handling robot loads two workpieces at a time into said workpiece boat starting at an upper position in said workpiece boat and proceeding downward.

12. The system of claim 10, wherein said workpiece handling robot unloads two workpieces at a time out of said workpiece boat starting at a lower position in said workpiece boat and proceeding upward.

13. The system of claim 1, wherein said magnet system includes an electromagnet or a permanent magnet.

14. The system of claim 1, wherein said magnet system includes a solenoid magnet or a Helmholtz magnet.

15. The system of claim 1, wherein said magnet system includes a superconducting magnet.

16. The system of claim 1, wherein said magnet system generates a magnetic field within said processing space having a magnetic field strength ranging up to 5 Tesla.

17. The method of claim 1, wherein said at least one heating element elevates a temperature of said plurality of workpieces to a peak temperature ranging up to about 600 degrees C.

18. A method of operating an annealing system including a first workpiece boat, a vertical furnace, a boat loader, and a magnet system, the annealing system comprising:
loading at least one hundred workpieces into said first workpiece boat;
vertically translating said first workpiece boat into a processing space of said vertical furnace using said boat loader, said vertical furnace having an inner cylindrical insulating tube and at least one heating element surrounding an outer surface thereof, said inner cylindrical insulating tube defining said processing space, wherein said annealing system has a total height less than 3.5 m;
elevating a temperature of said at least one hundred workpieces by coupling power to said at least one heating element; and
generating a magnetic field within said processing space using said magnet system arranged outside said vertical furnace.

19. The method of claim 18, further comprising:
prior to vertically translating said first workpiece boat, indexing said first workpiece boat from a load/unload position to a process position using a workpiece boat turntable arranged beneath said vertical furnace; and
loading at least one hundred workpieces into a second workpiece boat.

20. The method of claim 18, further comprising:
vertically extending a loading arm of said boat loader when vertically translating said first workpiece boat into said vertical furnace; and
vertically retracting said loading arm of said boat loader when vertically translating said first workpiece boat out of said vertical furnace.

21. The system of claim 2, wherein said workpiece boat turntable is configured to engage said boat workpiece boat in the process position through the opening.

* * * * *